(12) United States Patent
Rayssac et al.

(10) Patent No.: US 7,041,577 B2
(45) Date of Patent: May 9, 2006

(54) PROCESS FOR MANUFACTURING A SUBSTRATE AND ASSOCIATED SUBSTRATE

(75) Inventors: Olivier Rayssac, Grenoble (FR); Fabrice Letertre, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/972,158

(22) Filed: Oct. 22, 2004

(65) Prior Publication Data
US 2005/0112885 A1    May 26, 2005

Related U.S. Application Data

(63) Continuation of application No. PCT/IB2003/002431, filed on Apr. 30, 2003.

(30) Foreign Application Priority Data
Apr. 3, 2002    (FR) .................................. 02 05423

(51) Int. Cl.
*H01L 21/46*    (2006.01)
*H01L 21/30*    (2006.01)

(52) U.S. Cl. ..................... 438/458; 438/455; 438/456; 438/796

(58) Field of Classification Search .................. 438/456
See application file for complete search history.

(56) References Cited

U.S. PATENT DOCUMENTS

| 5,374,564 | A | 12/1994 | Bruel ........................... 437/24 |
| 6,027,958 | A | 2/2000 | Vu et al. ..................... 438/110 |
| 6,071,795 | A | 6/2000 | Cheung et al. ............. 438/458 |
| 6,100,166 | A | 8/2000 | Sakaguchi et al. .......... 438/455 |
| 6,177,359 | B1 * | 1/2001 | Chen et al. .................. 438/751 |
| 6,303,405 | B1 | 10/2001 | Yoshida et al. ............... 438/46 |
| 6,806,171 | B1 * | 10/2004 | Ulyashin et al. ............ 438/492 |
| 2003/0077885 | A1 | 4/2003 | Aspar et al. ................. 438/517 |

FOREIGN PATENT DOCUMENTS

| WO | WO 99/25019 | 5/1999 |
| WO | WO 01/04933 | 1/2001 |

OTHER PUBLICATIONS

W.P. Maszara et al. "Bonding Of Silicon Wafers For Silicon-On-Insulator", Journal of Applied Physics, vol. 64, p. 4943-4950, (1988).

* cited by examiner

*Primary Examiner*—Asok Kumar Sarkar
(74) *Attorney, Agent, or Firm*—Winston & Strawn LLP

(57) ABSTRACT

A process for producing a substrate is described. The process includes providing an assembly having a first layer weakly bonded to a temporary support at an interface therebetween. At least a portion of the first layer is selectively etched substantially to the interface to create an etched zone. A second layer is then bonded to un-etched portions of the first layer to cover the etched zone and to form a closed cavity. The first layer is detached from the temporary support at the weak bond by providing a raised pressure in the cavity.

30 Claims, 3 Drawing Sheets

PROCESS FOR MANUFACTURING A SUBSTRATE AND ASSOCIATED SUBSTRATE

CROSS-REFERENCE TO RELATED APPLICATIONS

This application is a continuation of International Application No. PCT/IB2003/002431 filed on Apr. 30, 2003, the entire content of which is expressly incorporated herein by reference thereto.

BACKGROUND ART

The present invention generally relates to the manufacture of substrates, and in particular semiconductor substrates, for use in electronics, optoelectronics or optics.

Transfer techniques are used more and more frequently to manufacture such substrates, wherein more or less thick layers are transferred from one support to the other. In numerous applications in the field of microelectronics, therefore, a thin semi-conductive layer present on the surface of a first substrate (donor substrate) can be transferred to a second substrate (target substrate). Typically, this thin layer will be epitaxially grown, and prior to transfer will have undergone at least some of the technological stages utilized for manufacturing components. For example, a thin layer made of gallium nitride GaN can be arranged to include a fragile interface at the center of the first substrate to define a zone of weakness. Transfer is accomplished by first placing the exposed face of the thin layer, borne by the first substrate, in contact with a face of the second substrate. Adequate adhesion is ensured between the two contacting faces, and then detachment is carried out between the first substrate and the thin layer at the zone of weakness.

In general, different ways of producing a fragile bond are already known. A first technique consists of implanting ionic gaseous species, then submitting the implanted weakened zone to thermal and/or mechanical treatment or to another energy source, to a breaking point, as described for example, in U.S. Pat. No. 5,374,564. Another known technique consists of producing a layer of embedded oxide and attacking this layer by etching, as described, for example, in U.S. Pat. No. 6,027,958. Other known solutions consist of obtaining a fragile interface by creating a porous layer, as described, for example in document U.S. Pat. No. 6,100,166, and optionally implanting gaseous species into this layer to weaken it to the desired extent. An alternative to such processes that provide a zone of weakness, is a process consisting of eliminating the first substrate by a mechanical-chemical softening method, as described, for example, in published International Application No. WO 99/25019 A1, the major drawback being a significant loss of material.

It is also known to define the fragile plane by defining the interface between two different materials, and then submitting them to a specific treatment. Thus, in the case of a structure that includes a thin layer of gallium nitride GaN on a first substrate made of sapphire ($Al_2O_3$), the thin layer can be transferred by a technique known as laser lift-off. Laser lift-off consists of irradiating the GaN/sapphire interface using a laser to decompose and thus weaken the interface to the desired extent, and then cause detachment (in particular, see U.S. Pat. No. 6,071,795).

The adhesion of the free face of the thin layer and of the target substrate can be undertaken by a number of known processes. For example, an adhesive agent such as a duroplastic or photo-treatable glue could be used, as could anodic sealing, eutectic gluing, metallic fusion, and the like.

Detachment of the donor substrate and the thin layer is typically accomplished by applying mechanical traction forces and/or shearing forces and/or flexing forces. For example, a blade (see especially W. P. Maszara, G Goetz, A. Caviglia, J. B. McKiterrick, Journal of Applied Physics, vol. 64, p. 4943, 1988), or a fluid jet could be used, as described in International Patent Application No. WO 01/04933 A1.

There are disadvantages associated with each of the different known processes. First, it can be difficult to master or control the effective bond forces at the weakened interface which could make detachment difficult, if not impossible to accomplish. Consequently, the mechanical forces required to cause detachment can be substantial, which risks deterioration or breakage of the substrates. This risk is even higher in the case where such forces, or part of these forces, are applied by hand by using a tool.

Accordingly, there is a need for improvements in these type processes, and these improvements are now provided by the present invention.

SUMMARY OF THE INVENTION

The present invention now eliminates the limitations of the prior art by providing a process for manufacturing substrates in which detachment between two parts of an intermediate substrate can be effected simply and efficiently, without manual intervention. The present invention also adjusts the distribution of the amplitude of forces likely to cause detachment over all or part of the whole substrate.

Specifically, the invention relates to a process for producing a substrate. The process includes providing an assembly including a first layer weakly bonded to a temporary support at an interface therebetween, then selectively etching at least a portion of the first layer substantially to the interface to create an etched zone. The process also includes bonding a second layer to un-etched portions of the first layer to cover the etched zone and form a closed cavity, and detaching the first layer from the temporary support at the weak bond by providing a raised pressure in the cavity.

In a preferred embodiment, the invention also includes selectively etching portions of the first layer substantially to the interface to create a pattern of etched zones, bonding the second layer to the un-etched portions of the first layer to cover the etched zones and form a plurality of closed cavities, and detaching the first layer from the temporary support at the weak bond by providing raised pressures in the cavities. The technique also advantageously includes providing substantially uniformly raised pressure in the cavities over the entire substrate. In an alternate implementation, the process includes raising the pressure in the cavities in a non-uniform manner over the substrate, and may include raising the pressure to a greater extent in the cavities that are located near the substrate periphery. Advantageously, the cavity contains a gas and the pressure is raised by raising the pressure of the gas, or the cavity contains a gas and the pressure is raised by raising the temperature of the gas.

In an advantageous implementation of the invention, etching includes forming a pattern of elongated cavities in the first layer, and the cavities may be evenly distributed over at least part of the substrate. In addition, the cavities may be evenly distributed over the entire substrate, and at least certain cavities may form channels which communicate with one another. The cavities may also be insulated from each other. The process may also advantageously include depositing at least part of the first layer directly upon the temporary support, and the first layer beneficially includes a thin growth layer and the deposited first layer, wherein the weak bond is created between the temporary support and the thin growth layer. In addition, the thin growth layer may be attached to the temporary support by layer transfer from a donor substrate, and the weak bond may be created by limiting the adhesive energy between the thin transferred layer and the temporary support.

In another preferred embodiment, a material of the first layer and an adjacent material of the temporary support exhibit sufficiently different thermal dilatation coefficients such that a rise in temperature causes shearing at an interface between the first layer and the temporary support. In addition, the first and second layers may be made of materials that exhibit sufficiently close thermal dilatation coefficients such that the rise in temperature does not cause any degradation of adhesion between the materials or layers. Beneficially, the material of the second layer is quartz, and the material of the first layer is at least one of a mono- or poly-metallic nitride.

Another aspect of the invention pertains to a substrate for producing micro-electronics, optoelectronics or optics components. The substrate includes a first layer, a temporary support weakly bonded to the first layer at an interface therebetween, at least one cavity formed in the first layer substantially to the interface, and a second layer bonded to the first layer. The second layer covers the at least one cavity such that a raised pressure can be generated within the at least one cavity to detach the first layer from the temporary support at the weak bond.

In a preferred embodiment, the first layer includes a plurality of cavities, and the second layer is bonded to the first layer to cover the cavities. In an implementation, the at least one cavity has an elongated shape, and the substrate includes a pattern of evenly distributed cavities. In another advantageous embodiment, the cavities are separated from one another. Alternately, at least certain cavities form channels which communicate with one another.

In a beneficial embodiment, the weak bond is present between the temporary support and a thin growth layer. In addition, the first layer and temporary support are made of materials that exhibit sufficiently different thermal dilatation coefficients such that an increase in temperature causes shearing at the interface between the first layer and the temporary support. The material of the first layer may be at least one of a mono- or poly-metallic nitride.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

Figure 1:
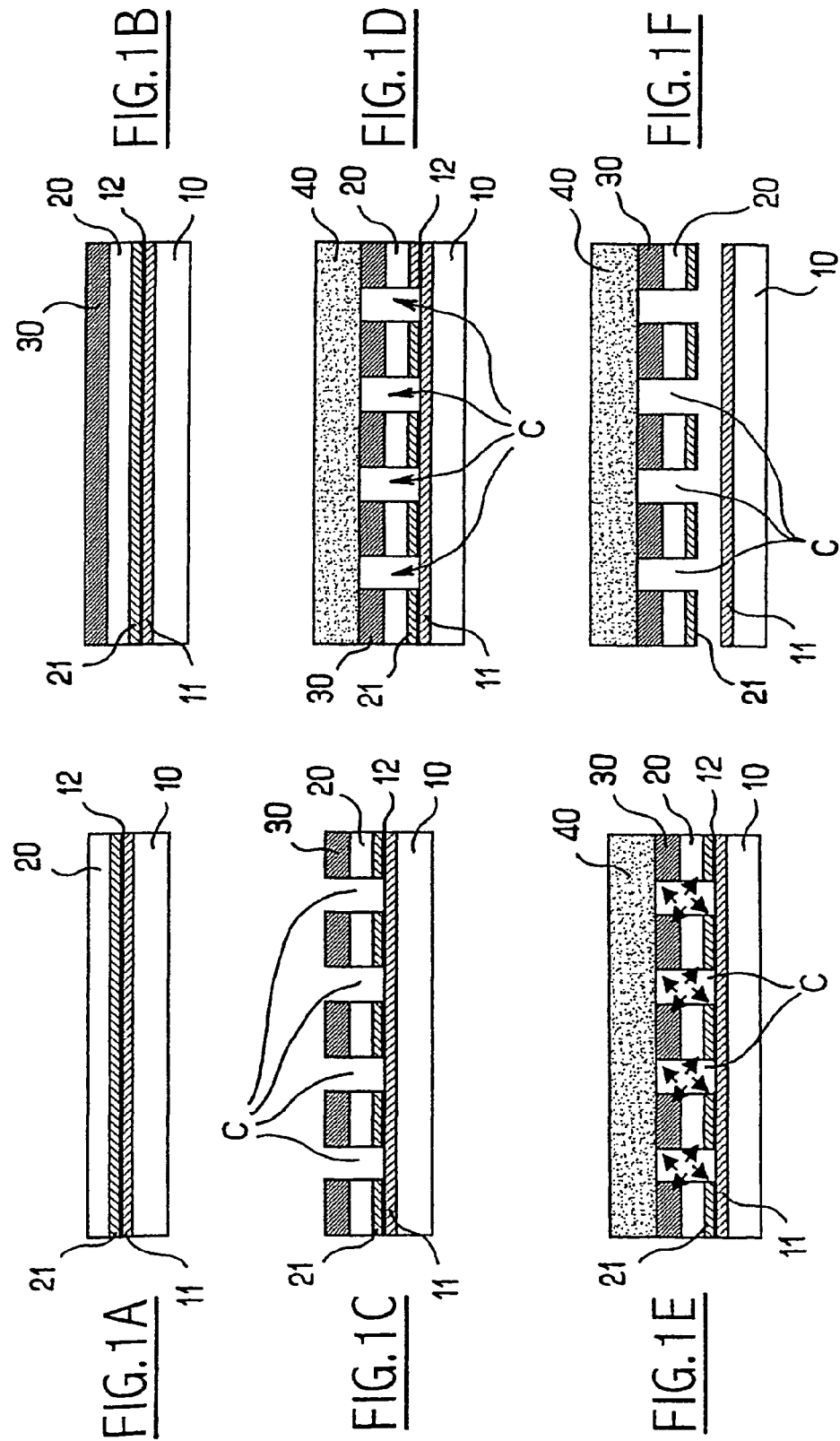
FIGS. 1A to 1F are sectional views of the different stages of a process according to the present invention.

According to a first aspect, the invention provides a process for producing a substrate for creating components in micro-electronics, optoelectronics or optics. In particular, a substrate includes a first layer, wherein at least a part of the first layer is on a temporary support. A fragile bond in the vicinity of the interface between the first layer and the temporary support is created. Next, the first layer is selectively and locally etched at least substantially to the level of the fragile. A second layer is then bonded to the first layer carried by the temporary support to cover the etched zones, in such a way that the etched zones form one or more essentially closed cavities. The closed cavities are distributed over the extent of the substrate. The resulting whole is exposed to constraints so as to separate the first layer from its temporary support at the fragile bond.

Certain preferred, though non-limiting, aspects of the process may be included. In particular, the constraints may originate at least in part from raising the pressure of a fluid contained in the cavity or cavities. The pressure of the fluid could be raised in an essentially uniform manner over the whole substrate, or may be raised in a non-uniform manner. In an alternative technique, the pressure of the fluid could be raised such that it is greater in the vicinity of an edge of the substrate. The fluid may be a gas, and raising the pressure is caused raising the temperature of the gas.

In a particular embodiment, an ensemble of elongated cavities is formed, and the cavities could be evenly distributed. It is envisioned that the cavities are made in the intermediate zones separating useful zones of the substrate in which components can be made. The cavities may be isolated from each other, or at least certain cavities could form channels which communicate with one another.

In an implementation, the first layer is formed on the temporary support at least in part by deposit. In addition, the fragile bond is created between the temporary support and a thin growth layer of the deposit, attached to the temporary support, wherein the first layer is made of a thin growth layer and by the deposited layer. The thin growth layer could be attached to the temporary support by layer transfer from a donor substrate. In an embodiment, the weak bond is created by limiting the adhesive energy between the thin transferred layer and the temporary support. In another implementation, the second layer constitutes a mechanical support for the first layer and is part of the substrate.

In a beneficial embodiment, the material of the first layer and an adjacent material of the temporary support exhibit thermal dilatation coefficients that are sufficiently different from one another for a rise in temperature to cause constraints in shearing at the level of the interface between the first layer and the temporary support. In addition, the a material of the first layer adjacent to the second layer, and the material of the second layer, advantageously exhibit sufficiently close thermal dilatation coefficients for the rise in temperature not to cause any degradation of the adhesion between these materials. The second layer may be bonded onto the first layer by sealing, and the second layer could be made of quartz. Also, the material of the first layer adjacent to the second layer could be made of a mono- or poly-metallic nitride.

According to a second aspect of the present invention, presented is a substrate for producing components for microelectronics, optoelectronics or optics applications. The substrate includes a first layer, a temporary support on which the first layer is fixed, with the interface between the first layer and the temporary support comprising a fragile bond, and one or more cavities formed locally in the material of the first layer substantially to a level of the fragile bond. The cavities open onto the exterior of the side of the free face of the first layer such that, by adhering a second layer to the first layer to cover the etched zones, a pressure tending to separate the first layer from its temporary support at the fragile bond can be generated in the hermetic cavities.

Certain preferred, though non-limiting, aspects of this substrate include cavities having an elongated shape, and cavities that are evenly distributed. Advantageously, the cavities are made in intermediate zones separating useful zones of the substrate in which components can be produced. The cavities could be separated from one another, or at least certain cavities could form channels which communicate with one another. In a preferred implementation, the fragile bond is between the temporary support and a thin growth layer, wherein the substrate includes the thin growth layer and the deposited layer. In another preferred embodiment, the material of the first layer and an adjacent material of the temporary support exhibit thermal dilatation coefficients that are sufficiently different so that an increase in temperature, to which the assembly including the first layer attached to the temporary support and to the second layer is exposed, to cause shearing constraints at the interface between the first layer and the temporary support. In addition, the material of the first layer adjacent to its free face may be made of a mono- or polymetallic nitride.

The following description is an example of an implementation of the present process, based on a first substrate made of silicon on insulator (SOI) material known for use as a detachable substrate, and a second substrate made of quartz.

FIG. 1A illustrates a detachable first substrate, which comprises a generally relatively thick (at least several hundreds of μm) layer 10, which is made of monocrystalline silicon having a crystallographic orientation [100] to form a temporary support. A layer 20 is generally less thick, and here is made of monocrystalline silicon of crystallographic orientation [111], attached to the layer 10 by a fragile bond via molecular adhesion, indicated at 12. This fragile bond is preferably not made directly between the silicon layers, but at the level of two layers 11 and 21 of oxide $SiO_2$ that have been formed on the layers 10 and 20, preferably by thermal oxidation.

The fragile nature of the bond 12 results, for example, from gluing or bonding by molecular adhesion. The appropriate treatment of the surfaces to be bonded may include limiting the thermal energy contribution, and/or utilizing relatively rugged contact surfaces, so that the bond energy is limited at the adhesion interface. Typically, this energy is limited to less than 1 Joule/$m^2$. Other techniques for making the fragile bond 12 can also be implemented. An example is a technique of weakening by implantation as described in U.S. Published Application No. 2003/077,885 A1.

Referring to FIG. 1B, a layer 30 of gallium nitride GaN is epitaxially grown on the free face of the layer 20. If necessary, the free face of the layer 30 is polished to a suitable degree of roughness to allow solid bonding to another substrate, as will be seen hereinbelow. After this optional polishing, the assembly made up of layers 30 and 20 is selectively and geometrically etched so as to create an ensemble of channels distributed over the assembly produced to this point, with etching units such as will be detailed below. According to the nature of the materials, and if necessary in terms of the constraints associated with the process, such etching is either dry or wet etching.

For example, dry etching based on chlorine compounds is accomplished by first applying a mask formed by a photosensitive resin (selectivity in a ratio of around 0.7:1 to 0.9:1 relative to GaN), or by a silicon oxide deposit (with a selectivity of around 8:1 to 10:1), or formed by a nickel deposit (selectivity of around 30:1) on the surface of the layer 30 of GaN. After etching, the mask is removed by an appropriate technique, typically by using $O_2$ plasma, or by utilizing a solvent in the case of a photosensitive resin, or by using reactive monic etching in the case of a deposit of $SiO_2$, or by utilizing a chemical bath $H_2SO_4/H_2O_2$ (with concentration ratios close to 3:1) in the case of nickel.

Once the layer 30 is fully etched at the etching zones, the layer 20 is attacked in turn. For example, a wet etching process using a mixture of fluorhydric acid HF and nitric acid $HNO_3$ could be used, or it could be attacked by using another dry process of sulphur hexafluoride $SF_6$. Next, the thin layer of $SiO_2$ is etched in turn, with the time of exposure to the etching agent, the concentration of the latter, and more generally the other etching conditions being determined to control cutting of the oxide layer 21 so that it terminates in the region of the adhesion interface.

It is understood that in terms of the nature of the materials to be etched, one of skill in the art will know how to choose the appropriate etching agents. The table below gives several examples for silicon, silicon carbide, silicon nitride and silicon oxide.

| Material to be etched | Agents for wet process | Agents for dry process |
|---|---|---|
| Si | —HF/HNO3 mixture<br>—KOH at around 70° C.<br>—TMAH at around 70° C. | —$SF_6$ |
| SiC | | —$SF_6$ and $O_2$ mixture |
| $Si_3N_4$ | —H3PO4 at around 180° C.<br>—HF | —$CHF_3$, $O_2$ and $SF_6$ mixture |
| $SiO_2$ | —HF | —$CHF_3$ and $SF_6$ mixture |

The resulting structure is illustrated in FIG. 1C, which demonstrates a certain number of cavities C resulting from the etching.

Figure 5:
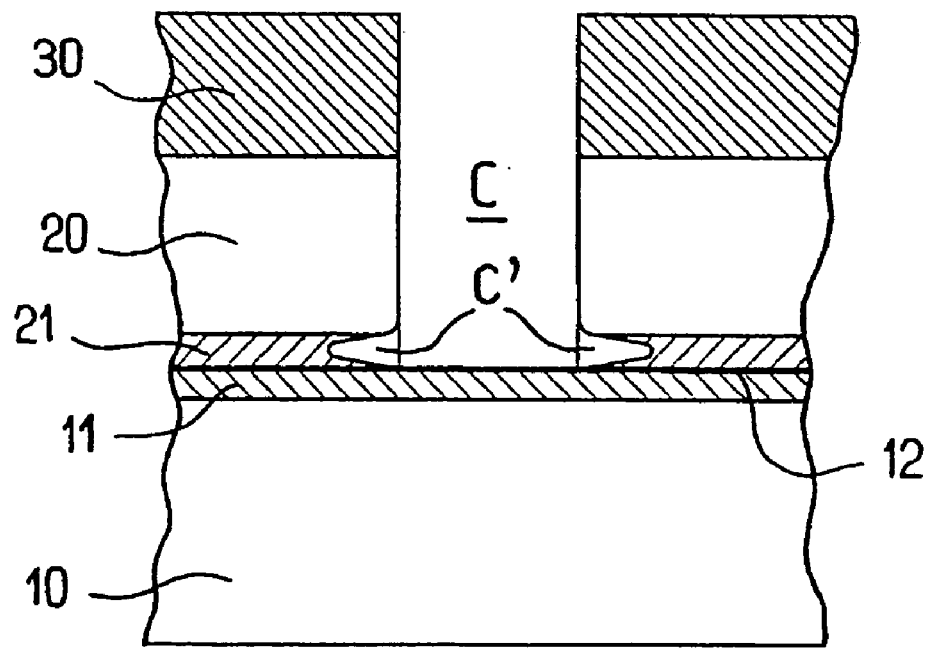
FIG. 5 is a sectional, enlarged view of an advantageous phenomena likely to be attained during the stage illustrated in FIG. 1C.

According to an advantageous aspect, and as illustrated in FIG. 5, provision can be made to perform the etching of the layer 21 such that the etching agent likewise attacks the layer 20 transversely in the main direction of etching, that is, along the fragile bond 12. This creates secondary cavities C' which contribute, as will be specified below, to facilitating the detachment at the level of the fragile bonds.

The next stage consists of attaching the illustrated structure in FIG. 1C to a definitive support made of quartz 40. The quartz support 40 is bonded to the side of the layer of subsisting GaN 30. This attachment is made especially by sealing using an adhesive agent such as polymerizable glue (cyano-acrylate glue, epoxy resin, etc.), a hot-melt adhesive, a resin, or by bonding by molecular adhesion, or by metallic gluing, or even by anodic sealing, so as to create a solid bond between the free faces of the subsisting zones of the layer of GaN 30 and the quartz plate 40. Solid bonding is understood to mean a bond substantially more solid than the fragile bond made at the level of the bonding interface 12, as described above.

FIG. 1D illustrates the entire assembly, and it should be noted that that the cavities C, which contain either air, or a gaseous medium in which the operation of bonding with the quartz plate 40 takes place, are isolated from the outside environment. The next step consists of submitting this assembly to heat so as to augment the pressure of the gas contained in the cavities. As indicated by the arrows in FIG. 1E, this pressure is exerted uniformly on all the walls of the cavities, and especially on the oxide layer 11 initially belonging to the temporary substrate 10. When this pressure is adequate, the forces it engenders tend to separate the materials situated on either side of the bonded interface, so that the forces become greater than the adhesion forces prevalent at this bond. This results in detachment of the assembly made up of the quartz plate 40, the subsisting zones of the layer 30 of GaN, of the layer 20 of silicon and of the thin oxide layer 21 from the oxide layer 11, as illustrated in FIG. 1F. If present, the transverse cavities C' shown in FIG. 5 can result in detachment with a reduced gas pressure, because they contribute to weakening the bond. Next, layers 21 and 20 can be eliminated, if needed, by mechanical and/or chemical attack, with the GaN zones then constituting useful zones for producing components (especially electroluminescent diodes, laser diodes, etc.).

It should be noted that technological steps for producing such components in the subsisting zones of the layer can be conducted between certain of the steps described above. In particular, such steps can be implemented after growth of the GaN layer, or even after all or part of the etching used to form the cavities C.

Figure 2:
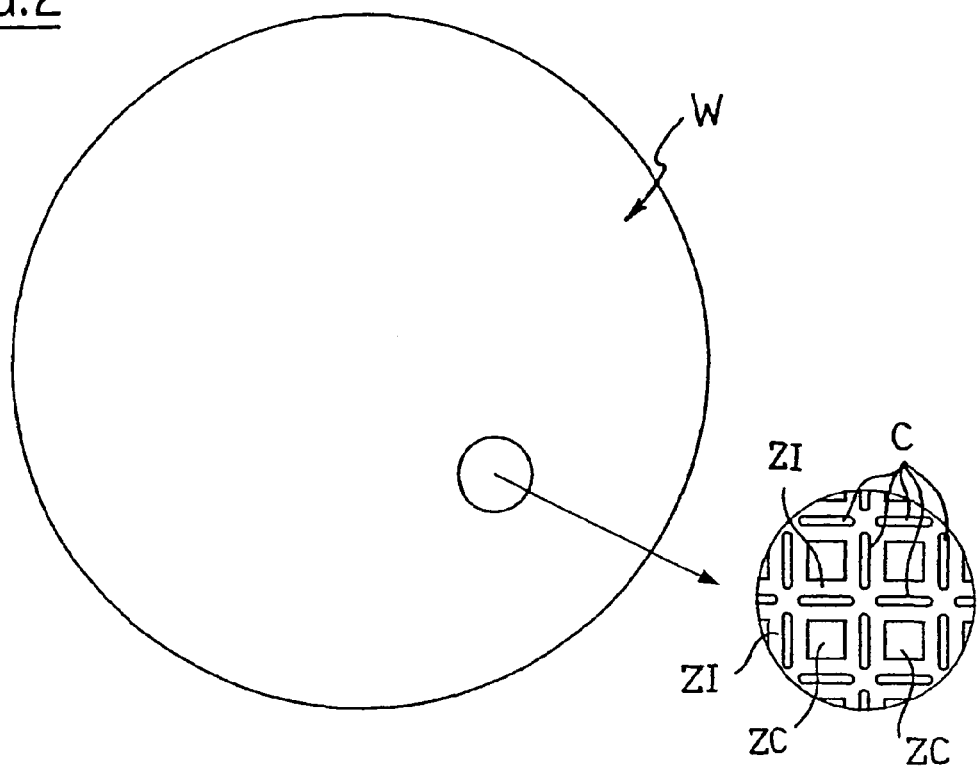
FIG. 2 is a plan view of a first arrangement of cavities according to the present invention.

Different possible arrangements or patterns for the cavities C will now be described in greater detail. In particular, FIG. 2 is a plan view of a typically circular contour of a diameter of 2 to 12 inches, with inserts and various layers intervening in the process described above, and the assembly before the adhesion step is designated by reference W. Electronic components are conventionally produced in a substrate fabricated using this procedure, in a series of zones of components ZC that are evenly distributed over the surface of the substrate. To prevent diminishing the useful capacity of the substrate in terms of producible components, the cavities C are formed as a pattern of more or less elongated cavities in the intermediate zones ZI that separate the zones of components ZC. In the embodiment of FIG. 2, these cavities are oblong and extend in two perpendicular directions between adjacent zones of components ZC. In this case a large number of independent cavities is created. This is advantageous because where detachment has started, or where peripheral cavities may have leaks towards shorn edges of the insert, the other cavities remain well pressurized to contribute to the detachment or to continuing the detachment.

Figure 3:
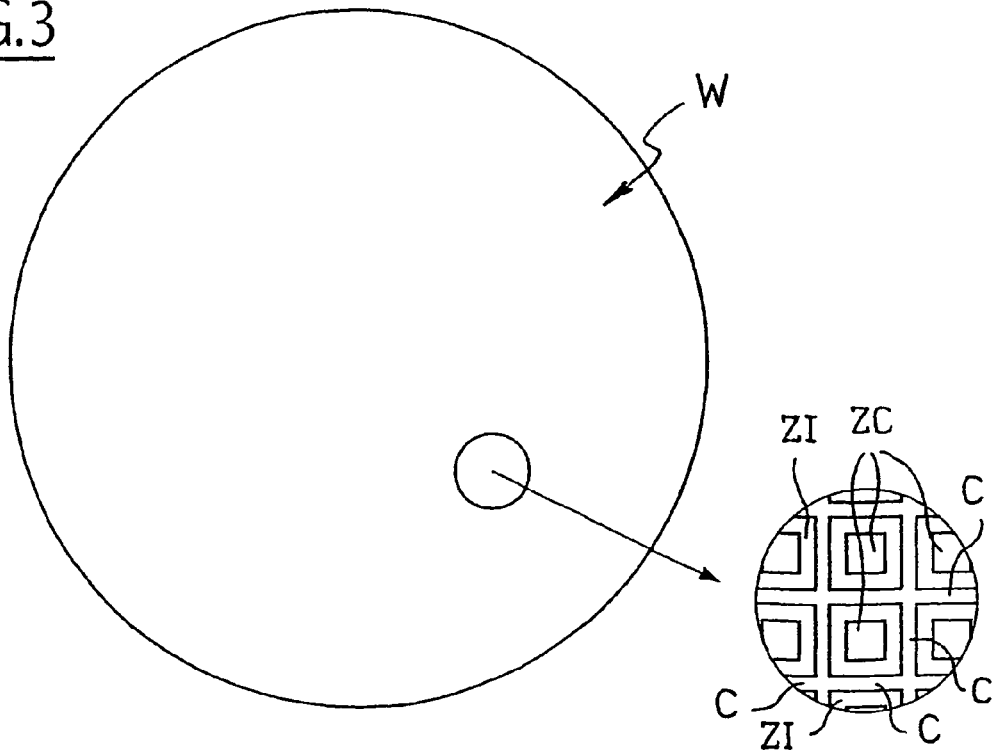
FIG. 3 is a plan view of a second arrangement of cavities according to the present invention.

As shown in FIG. 3, a pattern of cavities according to an orthogonal meshed network can also be created. In this implementation, a cavity is always arranged between two zones of adjacent components all of which intercommunicate to form a unique cavity. The advantage in this case is that the pressure accumulating in this cavity is uniform, such that the force exerted on either side of the cavities in the direction of the thickness of the insert, and which will occur at the origin of detachment, is likewise uniform.

Any other type of configuration can also be provided for the cavities. In particular, with respect to the embodiment of FIGS. 2 and 3, the cavities can be configured with an either greater or lesser surface density. The shape of the cavities can also be adjusted, and do not have to necessarily be oblong. For example, the shape of the cavities can be circular, ovoid, polygonal, or some other shape, the configuration resulting simply from masking units provided on the etching mask. Further, even though the present invention has been described above in its application to certain specified materials, it applies to numerous other materials.

In particular, the starting substrate may comprise a layer 20 of monocrystalline SiC on a layer 10 of silicon, or a layer 20 of monocrystalline SiC on a layer 10 of polycrystalline SiC, or even a layer 20 of monocrystalline or polycrystalline Si on a layer 10 of polycrystalline SiC, wherein the layers of $SiO_2$ 11 and 21 are always at the level of the fragile interface. Interface layers made of $Si_3N_4$ and the like can also be provided at the level of the fragile or weak bond.

Figure 4:
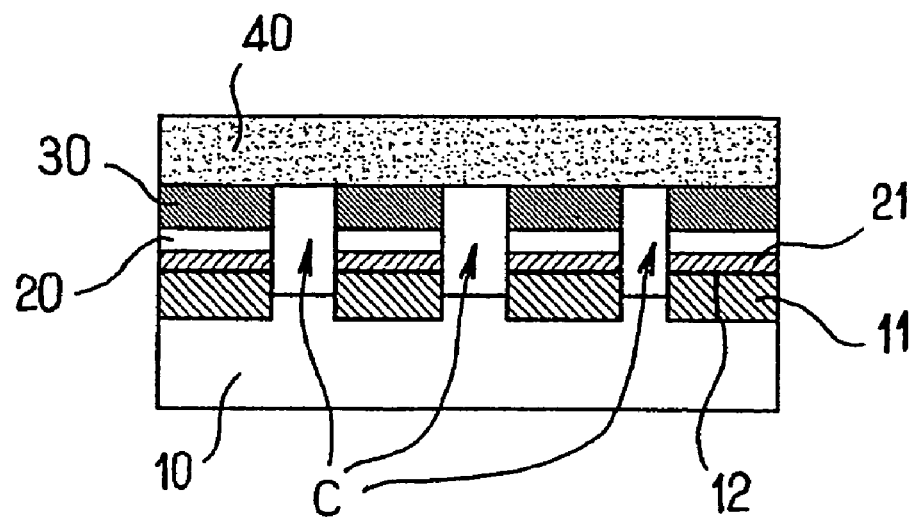
FIG. 4 is a sectional view of a variant of an intermediate structure according to the present invention (in the state corresponding to FIG. 1D)

FIG. 4 illustrates another example of the invention. In this embodiment, the support 40 is made of silicon, the layer 30 is made of GaN, the layer 20 is made of SiC, the layers 11 and 21 are made of $SiO_2$, and the layer 10 is made of SiC.

The present invention is understandably not limited to the embodiments described above and illustrated in the diagrams, but one skilled in the art will know how to contribute numerous variants and modifications. In particular, the support 40, such as described above, can be either a final support for the substrate, or can be a simple covering agent that ensures that the cavities are sealed, at least during the pressurization phase. In this case, the layer 40 need not extend over the entire surface of the substrate, but must at least hermetically cover the cavities. If required, this layer can then be partially or fully eliminated.

In addition, an arrangement can be implemented to effect heating intended to pressurize the gas contained in the cavities in a non-uniform manner, so that the forces generated by the pressure are different according to the location in question. In particular, such a method can be used to initiate desired separation in an edge region of the insert, by heating the insert at the level of the edge in question.

Furthermore, a component manufacturer can be supplied with an intermediate product comprising layers 20 and 30 (or any mono- or multi-layer variant), the intermediate support and the etched cavities, but without the layer 40. In this case the cavities are open. Thus, it is the manufacturer who will attach the layer 40 to hermetically seal the cavities and who will pressurize the gas or other fluid in the cavities.

In accordance with another refinement of the procedure, detachment of the layers 20, 30, 40 from the temporary support can be performed by a combination of forces that originate from the pressure in the cavities C and other forces that originate from internal constraints that are generated because the material of the layer 20 and the material of the temporary support 10 exhibit thermal dilatation coefficients different from one another. For example, if the temporary support 10 and the layer 20 are made of silicon (whose thermal dilatation coefficient is $2.5 \times 10^{-6}$) and if the layer 40 is made of quartz (whose thermal dilatation coefficient is $0.5 \times 10^{-6}$), shearing constraints are created at the region of the fragile interface 12 which, when combined with the traction constraints created by the gaseous pressure in the cavities, aid detachment of the temporary support 10.

Other examples of material exhibiting thermal dilatation coefficients sufficiently different to support this phenomenon are the following:

| Material | Thermal dilatation coefficient |
| --- | --- |
| SiC | $4.5 \times 10^{-6}$ |
| GaN | $5.6 \times 10^{-6}$ |
| sapphire ($Al_2O_3$) | $6.5 \times 10^{-6}$ |

It should be noted that adequate attachment at the interface between the layer 30 and the layer 40 is provided such that, even if the materials of these two layers exhibit different thermal dilatation coefficients, the heating provided to pressurize the gas in the cavities does not cause undesirable defects (weakening, warping, etc.) at their interface.

What is claimed is:

1. A process for producing a substrate, comprising:
providing an assembly including a first layer weakly bonded to a temporary support at an interface therebetween, wherein a weak bond having a bond energy that is less than about 1 joule/m$^2$ is provided at the interface between the first layer and temporary support;
selectively etching the first layer substantially to the interface without damaging the temporary support to create an etched zone;
bonding a second layer to un-etched portions of the first layer to cover the etched zone and form a closed cavity; and
detaching the first layer from the temporary support at the weak bond by providing a raised pressure in the cavity.

2. The process of claim 1 which further comprises
selectively etching portions of the first layer substantially to the interface to create a pattern of etched zones;
bonding the second layer to the un-etched portions of the first layer to cover the etched zones and form a plurality of closed cavities; and
detaching the first layer from the temporary support at the weak bond by providing raised pressures in the cavities.

3. The process of claim 2, which further comprises providing substantially uniformly raised pressure in the cavities over the entire substrate.

4. The process of claim 2, which further comprises raising the pressure in the cavities in a non-uniform manner over the substrate.

5. The process of claim 4, which further comprises raising the pressure to a greater extent in the cavities that are located near the substrate periphery.

6. The process of claim 2, wherein the etching comprises forming a pattern of elongated cavities in the first layer.

7. The process of claim 6, wherein the cavities are evenly distributed over at least part of the substrate.

8. The process of claim 7, wherein the cavities are evenly distributed over the entire substrate.

9. The process of claim 6, wherein at least certain cavities form channels which communicate with one another.

10. The process of claim 2, wherein the cavities are insulated from each other.

11. The process of claim 1, wherein the cavity contains a gas and the pressure is raised by raising the pressure of the gas.

12. The process of claim 1, wherein the cavity contains a gas and the pressure is raised by raising the temperature of the gas.

13. The process of claim 1, which further comprises depositing at least part of the first layer directly upon the temporary support.

14. The process of claim 13, wherein the first layer comprises a thin growth layer and the deposited first layer, and wherein the weak bond is created between the temporary support and the thin growth layer.

15. The process of claim 1, wherein the thin growth layer is attached to the temporary support by layer transfer from a donor substrate.

16. The process of claim 15, wherein the weak bond is created by limiting the adhesive energy between the thin transferred layer and the temporary support.

17. The process of claim 1, wherein the second layer comprises a mechanical support for the first layer.

18. The process of claim 1, wherein a material of the first layer and an adjacent material of the temporary support exhibit sufficiently different thermal dilatation coefficients such that a rise in temperature causes shearing at an interface between the first layer and the temporally support.

19. The process of claim 18, wherein the first and second layers are made of materials that exhibit sufficiently close thermal dilatation coefficients such that the rise in temperature does not cause any degradation of adhesion between the materials or layers.

20. The process of claim 1, wherein the second layer is bonded onto the first layer by sealing.

21. The process of claim 1, wherein the material of the second layer is quartz.

22. The process of claim 21, wherein the material of the first layer is at least one of a mono- or poly-metallic nitride.

23. A substrate for producing micro-electronics, optoelectronics or optics components, comprising:
a first layer wherein the material of the first layer is at least one of a mono- or poly-metallic nitride;
a temporary support weakly bonded to the first layer at an interface therebetween, wherein a weak bond having a bond energy that is less than about 1 joule/m$^2$ is provided at the interface between the first layer and temporary support;
at least one cavity formed in the first layer substantially to the interface; and
a second layer bonded to the first layer and covering the at least one cavity such that a raised pressure can be generated within the at least one cavity to detach the first layer from the temporary support at the weak bond.

24. The substrate of claim 23, wherein the first layer includes a plurality of cavities, and the second layer is bonded to the first layer to cover the cavities.

25. The substrate of claim 24, further comprising a pattern of evenly distributed cavities.

26. The substrate of claim 25, wherein the cavities are separated from one another.

27. The substrate of claim 25, wherein at least certain cavities form channels which communicate with one another.

28. The substrate of claim 23, wherein the at least one cavity has an elongated shape.

29. The substrate of claim 23, wherein the weak bond is present between the temporary support and a thin growth layer.

30. The substrate of claim 23, wherein the first layer and temporary support are made of materials that exhibit sufficiently different thermal dilatation coefficients such that an increase in temperature causes shearing at the interface between the first layer and the temporary support.

* * * * *

UNITED STATES PATENT AND TRADEMARK OFFICE
CERTIFICATE OF CORRECTION

PATENT NO. : 7,041,577 B2
APPLICATION NO. : 10/972158
DATED : May 9, 2006
INVENTOR(S) : Rayssac et al.

It is certified that error appears in the above-identified patent and that said Letters Patent is hereby corrected as shown below:

Column 10,
Line 13, after "between the first layer and the" delete "temporally" and insert -- temporary --.
Line 27, after "a first layer" insert ",".

Signed and Sealed this

Eighteenth Day of July, 2006

JON W. DUDAS
*Director of the United States Patent and Trademark Office*